Jan. 9, 1968 R. K. OSWALD 3,363,189

SYNCHRONOUS DEMODULATOR

Filed April 19, 1965

INVENTOR.
RICHARD K. OSWALD
BY [signature]
ATTORNEY 3,363,189
SYNCHRONOUS DEMODULATOR Richard K. Oswald, San Jose, Calif., assignor to International Business Machines Corporation, Armonk, N.Y., a corporation of New York Filed Apr. 19, 1965, Ser. No. 449,129
16 Claims. (Cl. 329—50)

This invention relates generally to systems for carrier type amplification of D.C. signals and particularly to the demodulators used in such systems.

The stable amplification of low level D.C. signals is commonly accomplished by means of carrier amplifiers which provide high gain and low D.C. drift. In such systems the D.C. input signal is used to modulate an A.C. carrier which is amplified and demodulated to provide the amplified D.C. output signal. A discussion of this technique, sometimes referred to as chopping, is contained in volume 3 "Handbook of Automation, Computation and Control," John Wiley & Sons, New York, 1961, chapter 21. The demodulators used for this purpose commonly include one or more transformers or provide an inverted output signal. In some cases, the demodulator provides an output which is dependent on the source impedance of the driver. Since the source impedance of the driver may vary, corresponding variations exist at the demodulator output. These characteristics are generally undesirable from the cost or performance standpoint.

An additional problem exists in feedback systems. Since prior art demodulators do not contribute to the loop gain, all the gain must be provided by the carrier amplifier. This requires the amplifier to have wider dynamic range than would otherwise be the case.

In the system of my invention, the output of a carrier type amplifier is capacitively coupled to a D.C. amplifier. Synchronous detection is provided by a clamping circuit across the amplifier input, driven in synchronism with the carrier, to restore the D.C. level at this point. The pulsating D.C. is amplified through a path containing a first, low pass, filter. A second filter, having a high pass characteristic, is connected in a negative feedback loop within the D.C. amplifier. The resulting output from the amplifier is an amplified and integrated D.C. signal representing the D.C. level which modulated the carrier.

It is therefore an object of my invention to provide an improved demodulator.

Another object of my invention is to provide an improved demodulator which retains the polarity of the modulating signal.

Another object of my invention is to provide a non-inverting demodulator or integrator.

It is another object of my invention to provide an improved synchronous demodulator having substantial gain.

Another object of my invention is to provide an integrator having a time constant which is independent of the source impedance.

Still another object of my invention is to provide an integrator having a time constant which remains constant for the entire integration cycle.

The foregoing and other objects, features and advantages of the invention will be apparent from the following more particular description of a preferred embodiment of the invention as illustrated in the accompanying drawings in which.

Figures 1, 2, 3:
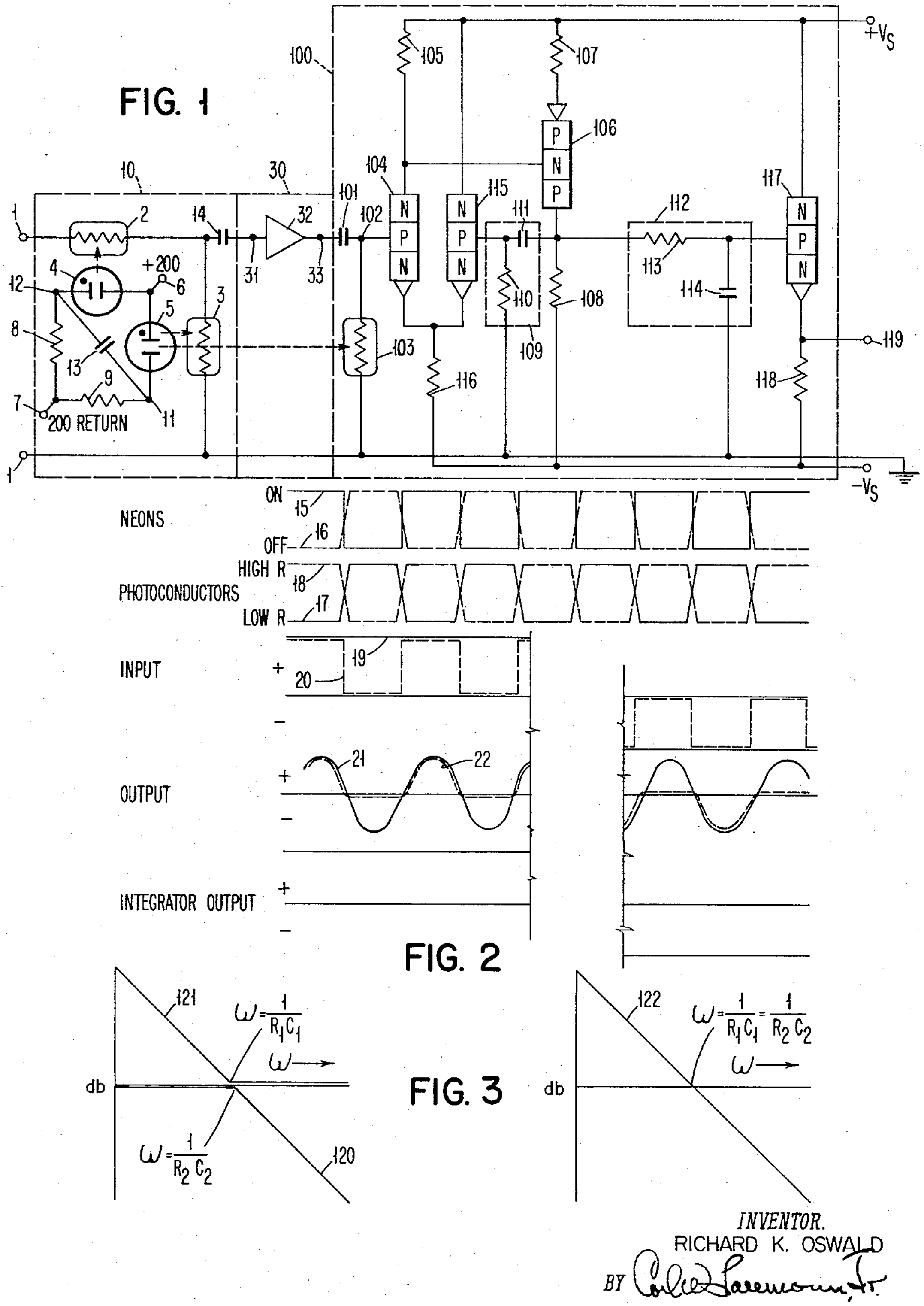
FIGURE 1 is a schematic drawing of a preferred embodiment of the invention.
FIGURE 2 is a timing and waveform chart for the described embodiment.
FIGURE 3 is illustrative of the frequency response characteristic of the demodulator of FIGURE 1.

The circuit shown in FIGURE 1 is a carrier type amplifier for low level D.C. signals. Such amplifiers consist of three basic elements; a modulator 10, an A.C. amplifier 30 and a demodulator 100. The D.C. signal is converted into an A.C. signal by modulator 10. The resulting A.C. signal is amplified by amplifier 30. Conversion of the amplified A.C. signal to D.C. and further amplification is accomplished by demodulator 100.

The D.C. signal is applied to input terminals 1. Such signals are developed by thermocouples and are in the range of 5 to 10 millivolts. The input signal is converted to a square wave by modulator 10 having a series photoconductor 2 and a shunt photoconductor 3. The photoconductors are alternately energized by the light from neon lamps 4 and 5. The circuit including neons 4 and 5 is a free running multivibrator.

When a 200 volt supply is connected to terminals 6 and 7, the potential across neon lamps 4 and 5 will increase as the stray capacitances are charged by current flowing through resistors 8 and 9. The minute capacitance differences together, with the variations in neon lamps, preclude a simultaneous firing of both lamps. Assuming that neon lamp 4 is the first to fire, the voltage drop thereacross abruptly decreases from the firing potential to the sustaining potential. Capacitor 13, connected between points 11 and 12, couples the resulting negative pulse to neon 5 thereby decreasing the voltage thereacross to a value substantially below that required for firing.

The current flowing through resistor 9 charges capacitor 13 toward the supply voltage until point 11 reaches a voltage sufficient to fire neon 5. The abrupt change in voltage at point 11 caused by a drop from the firing potential to the sustaining potential is coupled to point 12 by capacitor 13. The voltage across neon 4 is reduced to a value below that required to sustain conduction and neon 4 is extinguished. The output of the modulator 10 is taken through capacitor 14.

The timing sequence of the modulating system is shown in FIGURE 2. Solid curve 15 represents the cycle of neon 4. The dotted curve 16 is the cycle of neon 5. It will be recognized that the curves are idealized and represent timing only. The impedance of photoconductor 2 is shown as the solid curve 17 which is in the low impedance state when neon 4 is on. Photoconductor 3 provides an impedance according to dotted curve 18. It will be recognized that the curves are idealized and intended to represent timing only.

The impedance of photoconductors 2 and 3 ranges from 1K ohms when illuminated to 50M ohms when dark. When neon 4 is on and neon 5 is off, photoconductor 2 presents a low impedance and the signal voltage is applied through capacitor 14 to the input 31 of A.C. amplifier 32. During the next half cycle, photoconductor 2 is in the high impedance state and photoconductor 3 acts to discharge capacitor 14 and effectively short the input to amplifier 32. The D.C. input signal 19 is thereby converted into a square as represented by waveform 20.

The amplified A.C. wave 21 appears at output terminal 33 of amplifier 32. The amplified A.C. signal is coupled through capacitor 101 to input terminal 102 of demodulator 100. The other terminal connection is common ground. The amount of rounding which occurs is a function of the bandwidth of the amplifier. Performance of the system is not impaired by limited bandwidth as long as it remains constant. In passing through the A.C. amplifier 32 and capacitor 101, the orignal D.C. reference for the square wave input is lost. Where the input at terminals 1 is always of the same polarity, this loss of reference may be of no consequence. However, in many applications of this type of amplifier the input voltage at terminals 1 will be the difference between a feedback voltage and a single voltage. This error may have a positive or negative polarity.

To prevent loss of information which defines the input voltage polarity, a synchronous clamp is used in demodulation. The synchronous clamp may also be considered as a D.C. restorer. A variable impedance element, such as photoconductor 103, is operated in synchronism with photoconductor 3, both being driven by the light output from neon 5. Thus, input capacitor 14 and output capacitor 101 are shorted to ground potential at the same time. In this manner the restorer is operated in phase synchronism with the carrier. This may be seen from an examination of the input signal waveform 20 and the clamped, amplified output waveform 22 of amplifier 32. The effect of a polarity reversal at input terminals 1 is to reverse the polarity of the selected, or unclamped, pulses at the input to demodulator 100. A positive input voltage results in supply of the positive going pulses to demodulator 100. When the input voltage is negative, demodulator 100 receives the negative going pulses. In this manner the input polarity is restored to the amplified signal.

The portion of the waveform selected by the synchronous clamp is applied to base of NPN transistor 104. The amplified signal appearing across collector load resistor 105 is direct coupled to the base of PNP transistor 106. Resistor 107 establishes a reference current through transistor 106 for a zero signal input to the base of transistor 104. A further amplified signal appears across collector load resistor 108. At this point, the signal is still in pulse form but has a greater amplitude than the clamped input to the base of transistor 104.

The signal across load resistor 108 is used in two ways. The signal is applied in a negative feedback relation through a first, high pass, filter 109 having a resistor 110 and capacitor 111. The signal also passes to the output through a second, low pass, filter 112 having a resistor 113 and capacitor 114.

The output of high pass filter 109 is connected to the base of NPN transistor 115. The resistor 116, common to the emitters of transistors 104 and 115, completes the differential amplifier connection. A positive going signal at the base transistor 104 tends to produce a negative going response across resistor 105 and a positive going response across resistor 108. A positive going signal across resistor 108, coupled to the base of transistor 115, has just the opposite effect on the signal across resistor 105 to provide negative feedback. Since the high pass filter 109 is in the negative feedback loop to the base of transistor 115, the frequency response of the demodulator up to the load resistor 108 follows the curve 121 of FIGURE 3. Filter attenuation increases at frequencies below $$\omega=\frac{1}{R_1C_1}$$

where $R_1$ is the value of resistor 110 and $C_1$ is the value of capacitor 111 to provide very little negative feedback at low frequencies and realization of the full gain of the transistors 104 and 106. At frequencies above $$\omega=\frac{1}{R_1C_1}$$

the full output signal is applied as feedback and the gain of transistors 104 and 106 is therefore held at unity.

Low pass filter 112 transfers the signal existing across load resistor 108 to the base of emitter follower NPN transistor 117 having a load resistor 118. This filter has a frequency characteristic as shown by curve 120 in FIGURE 2. Attenuation increases with increasing frequency for frequencies greater than $$\omega=\frac{1}{R_2C_2}$$

where $R_2$ is the value of resistor 113 and $C_2$ is the value of capacitor 114. The overall characteristic of the demodulator from the input terminal 102 to the output terminal 119 is represented by curve 122 of FIGURE 3. This will be recognized as the composite of curves 120 and 121 when $1/R_1C_1$ is equal to $1/R_2C_2$.

results in an integration time constant which is independ-

An ideal demodulation system would accept input pulses of an amplitude of up to nearly $\pm V_s$ and provide an output voltage $E_0=\int E_i dt$ where $E_i$ is the input signal. It can be seen that the circuit described above comes very close to the performance of an ideal integrator. The resultant output is essentially a pure D.C. voltage equal to the volt time integral of the input voltage. Furthermore, the portions of the circuit which determine the integration time constant are isolated from the output impedance of the source and the input impedance of the load. This results in an integration time constant which is independent from impedance changes in either the source or the load.

While the invention has been particularly shown and described with reference to a preferred embodiment thereof, it will be understood by those skilled in the art that various changes in form and details may be made therein without departing from the spirit and scope of the invention.

What is claimed is:

1. A demodulator for a carrier type signal comprising;
a D.C. restorer,
means for applying a modulated carrier signal to said restorer,
means for operating said restorer in phase synchronism with the carrier,
and D.C. amplifier means connected to said restorer means,
said amplifier including a high pass filter in a negative feedback loop and a low pass filter in the output path, to provide a demodulated output signal.

2. A device according to claim 1 wherein said high pass filter and said low pass filter are of the resistance capacitance type having the same RC time constant.

3. A demodulator for a carrier type signal comprising;
a synchronous clamping circuit,
means for applying a modulated carrier signal to said clamping circuit,
means for operating said clamping circuit in phase synchronism with the carrier,
and D.C. amplifier means connected to said clamping circuit,
said amplifier including a high pass filter in a negative feedback loop and a low pass filter in the output path, to provide a demodulated output signal.

4. A device according to claim 3 wherein said high pass filter and said low pass filter are of the resistance capacitance type having the same RC time constant.

5. A demodulator for a carrier signal modulated by a signal having a D.C. component comprising;
a synchronous clamping circuit,
means for applying a modulated carrier signal to said clamping circuit,
means for operating said clamping circuit in phase synchronism with the carrier, to provide output pulses having a polarity responsive to the modulating signal polarity,
D.C. amplifier means connected to said clamping circuit,
a negative feedback loop in said amplifier,
said negative feedback loop including a first, series connected high pass filter,
and a second, low pass, filter in said amplifier output path to provide a demodulated output signal at the output of said D.C. amplifier.

6. A device according to claim 5 wherein said first and second filters are of the resistance capacitance type and have the same RC time constant.

7. A device according to claim 6 wherein the RC time constant satisfies the relation $$\omega=\frac{1}{RC}$$

where $\omega$ is the carrier frequency.

8. A synchronous demodulator for a carrier type signal amplifier comprising;

demodulator input terminals and output terminals, means for applying said carrier signal to said input terminals, a variable impedance element connected to said input terminals, means for varying said impedance element in synchronism with said carrier, a D.C. coupled amplifier, means connecting said input terminals to said D.C. coupled amplifier input, low pass RC filter means having a resistor $R_1$ and a capacitor $C_1$ connecting said output terminals to said D.C. amplifier output, high pass RC filter means having a resistor $R_2$ and capacitor $C_2$, and means connecting said high pass filter in a negative feedback relation to said D.C. coupled amplifier, said filters having a time constant $$\omega=\frac{1}{R_1C_1}=\frac{1}{R_2C_2}$$

where $\omega$ is a carrier frequency.

9. A synchronous demodulator for a carrier type signal comprising;

a D.C. coupled amplifier having input terminals and output terminals, a synchronously driven variable impedance element connected to said input terminals, a negative feedback loop in said amplifier, said feedback loop including a high pass RC filter, a low pass filter connected in the output path of said amplifier, and means for applying a carrier signal to said input terminals to provide a demodulated signal at said output terminals.

10. A device according to claim 9 wherein said high pass filter and said low pass filter are of the RC type having the same time constant.

11. A device according to claim 10 wherein the RC time constant satisfies the relation $$\omega=\frac{1}{RC}$$

where $\omega$ is the carrier frequency.

12. A synchronous integrator for extraction of the D.C. information contained on an A.C. carrier modulated by a D.C. signal, comprising;

a D.C. coupled amplifier having input and output terminals, a synchronous clamp connected across said input terminals, means for operating said clamp in synchronism with said carrier, circuit means for applying said modulated carrier to said input terminals, a negative feedback loop in said D.C. amplifier, said negative feedback loop including a first, series connected-high pass, RC filter, and a second, low pass, RC filter in the output path of said D.C. amplifier, said first and second filters having the same RC time constant to provide an amplifier frequency characteristic equal to $E_0=\int E_i dt$ where $E_0$ is the amplifier output voltage and $E_i$ is the voltage at said amplifier input terminals.

13. A synchronous integrator for extraction of the D.C. information contained on an A.C. carrier modulated by a D.C. signal, comprising;

a D.C. coupled amplifier having input and output terminals, a synchronous clamp connected across said input terminals, means for operating said clamp in synchronism with said carrier to restore the polarity of said D.C. signal by providing pulses to said D.C. amplifier having a polarity corresponding to said D.C. signal, circuit means for applying said modulated carrier to said input terminals, a negative feedback loop in said D.C. amplifier, said negative feedback loop including a first, series connected-high pass, RC filter to provide increased negative feedback at increasing frequency, and a second, low pass, RC filter in the output path of said D.C. amplifier, said first and second filters having the same RC time constant to provide an amplifier frequency characteristic equal to $E_0=\int E_i dt$ where $E_0$ is the amplifier output voltage and $E_i$ is the voltage at said amplifier input terminals.

14. A synchronous integrator for extraction of the D.C. information contained on an A.C. carrier modulated by a D.C. signal, comprising;

a direct coupled amplifier having input and output terminals, circuit means for applying said modulated carrier to said input terminals, a synchronous clamp connected across said input terminals, means for operating said clamp in synchronism with said carrier to restore the polarity of said D.C. signal by providing pulses to said D.C. amplifier having a polarity corresponding to said D.C. signal, and a negative feedback loop in said D.C. amplifier, said negative feedback loop including a first, series connected-high pass, RC filter to provide increased negative feedback at increasing frequency, and a second, low pass, RC filter in the output path of said D.C. amplifier, said first and second filters having the same RC time constant to provide an amplifier frequency characteristic equal to $E_0=\int E_i dt$ where $E_0$ is the amplifier output voltage and $E_i$ is the input voltage.

15. A synchronous integrator for extraction of the D.C. information contained on an A.C. carrier modulated by a D.C. signal, comprising;

a D.C. coupled amplifier having input and output terminals, circuit means for applying said modulated carrier to said input terminals, a variable impedance element connected across said input terminals, means for varying the impedance of said element between a high impedance condition and a low impedance condition in synchronism with said carrier to provide D.C. pulses, representing alternate half cycles of the carrier signal, to the D.C. amplifier, a negative feedback loop in said D.C. amplifier, and a first, series connected, high pass, RC filter in said negative feedback loop, and a second, low pass, RC filter in the output path of said D.C. amplifier, said first and second filters having RC time constants to provide an amplifier frequency characteristic equal to $E_0=\int E_i dt$ where $E_0$ is the amplifier output voltage and $E_i$ is the input voltage.

16. A synchronous integrator for extraction of the D.C. information contained on an A.C. carrier modulated by a D.C. signal, comprising;

a D.C. coupled amplifier having input terminals, output terminals and a differential stage, circuit means for applying said modulated carrier to said input terminals, a variable impedance element connected across said input terminals, means for varying the impedance of said element between a high impedance condition and a low impedance condition in synchronism with said carrier to provide D.C. pulses, representing alternate half cycles of the carrier signal, to the D.C. amplifier, circuit means connecting said input terminals to one input of said differential stage, a first, low pass, RC filter in the output path of said D.C. amplifier, and a second, high pass, RC filter connected between said output path and the other input to said differential stage to provide negative feedback, said first and second filters having RC time constants to provide an amplifier frequency characteristic equal to $E_o = \int E_i dt$ where $E_o$ is the amplifier output voltage and $E_i$ is the input voltage.

References Cited

UNITED STATES PATENTS

| | | | |
|---|---|---|---|
| 2,717,310 | 9/1955 | Woodruff | 328—127 |
| 3,014,135 | 12/1961 | Hewlett et al. | 330—10 X |
| 3,035,230 | 5/1962 | Jones | 329—50 |
| 3,058,068 | 10/1962 | Hinrichs et al. | 330—10 |
| 3,111,657 | 11/1963 | Bagno | 328—133 X |
| 3,265,980 | 8/1966 | Thompson | 329—50 X |

ALFRED L. BRODY, *Primary Examiner.*

ROY LAKE, *Examiner.*